(12) United States Patent
Han et al.

(10) Patent No.: US 8,125,073 B2
(45) Date of Patent: *Feb. 28, 2012

(54) WAFER INTEGRATED WITH PERMANENT CARRIER AND METHOD THEREFOR

(75) Inventors: Byung Joon Han, Singapore (SG); Nathapong Suthiwongsunthorn, Singapore (SG); Pandi Chelvam Marimuthu, Singapore (SG); Kock Liang Heng, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/004,111

(22) Filed: Jan. 11, 2011

(65) Prior Publication Data

US 2011/0101509 A1 May 5, 2011

Related U.S. Application Data

(63) Continuation of application No. 12/055,171, filed on Mar. 25, 2008, now Pat. No. 7,880,293.

(51) Int. Cl.
*H01L 23/04* (2006.01)

(52) U.S. Cl. ......... 257/698; 257/E21.123; 257/E21.502; 257/E27.026; 257/E27.027; 438/115; 438/118; 438/458; 438/459; 438/626

(58) Field of Classification Search ................... None
See application file for complete search history.

(56) References Cited

U.S. PATENT DOCUMENTS

| | | | |
|---|---|---|---|
| 5,567,657 A | 10/1996 | Wojnarowski et al. | |
| 6,040,235 A | 3/2000 | Badehi | |
| 6,342,406 B1 | 1/2002 | Glenn et al. | |
| 6,646,289 B1 | 11/2003 | Badehi | |
| 6,911,392 B2 | 6/2005 | Bieck et al. | |
| 7,160,478 B2 | 1/2007 | Leib et al. | |
| 2004/0262735 A1 | 12/2004 | Higashi et al. | |
| 2006/0035416 A1* | 2/2006 | Savastiouk et al. | 438/125 |
| 2006/0231750 A1 | 10/2006 | Chao et al. | |
| 2007/0172985 A1 | 7/2007 | Huang et al. | |

* cited by examiner

*Primary Examiner* — Alexander Ghyka
*Assistant Examiner* — Yasser Abdelaziez
(74) *Attorney, Agent, or Firm* — Robert D. Atkins; Patent Law Group: Atkins & Associates, P.C.

(57) ABSTRACT

A semiconductor device has a wafer for supporting the device and a conductive layer formed over a top surface of the wafer. A carrier wafer is permanently bonded over the conductive layer. Within the wafer and the carrier wafer, an interconnect structure is formed. The interconnect structure includes a first via formed in the wafer that exposes the conductive layer, a second via formed in the carrier wafer that exposes the conductive layer, a first metal layer deposited over the first via, the first metal layer in electrical contact with the conductive layer, and a second metal layer deposited over the second via, the second metal layer in electrical contact with the conductive layer. First and second insulation layers are deposited over the first and second metal layers respectively. The first or second insulation layer has an etched portion to expose a portion of the first or second metal layer.

33 Claims, 9 Drawing Sheets

WAFER INTEGRATED WITH PERMANENT CARRIER AND METHOD THEREFOR

CLAIM OF DOMESTIC PRIORITY

The present application is a continuation of U.S. patent application Ser. No. 12/055,171, filed Mar. 25, 2008, and claims priority to the foregoing parent application pursuant to 35 U.S.C. §120.

FIELD OF THE INVENTION

The present invention relates in general to semiconductor devices and, more particularly, to a semiconductor device with three-dimensional wafer-level integration having a permanent carrier.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation distance, lower capacitance, and achieve overall better circuit performance.

During wafer-level manufacturing, the wafer or the components formed over the wafer are easily damaged. For example, if the wafer is too thin, wafer breakage or wafer slip may occur during wafer handling resulting in significant yield loss and fabrication downtime. In an effort to increase the strength and durability of the wafer, a temporary wafer carrier is often bonded to the wafer to provide additional physical support. Although the temporary wafer carrier minimizes the likelihood of wafer damage, bonding and then de-bonding the carrier during wafer-level processing takes time and increases the duration and cost of manufacture. Furthermore, the bonding material used to attach the temporary wafer carrier limits the maximum temperature that can be used during wafer-level fabrication. Contemporary temporary bonding materials require the fabrication process to take place below 200° C., for example.

SUMMARY OF THE INVENTION

In one embodiment, the present invention is a semiconductor device including a wafer for supporting the semiconductor device, a conductive layer formed over a top surface of the wafer, a carrier wafer permanently bonded over the conductive layer, and an interconnect structure formed within the wafer and the carrier wafer. The interconnect structure includes a first via formed in the wafer that exposes the conductive layer, a second via formed in the carrier wafer that exposes the conductive layer, a first metal layer deposited over the first via, and a second metal layer deposited over the second via. The first and second metal layers are in electrical contact with the conductive layer.

In another embodiment, the present invention is a semiconductor device including a wafer for supporting the semiconductor device, a conductive layer formed over a top surface of the wafer, a carrier wafer permanently bonded over the conductive layer, and an interconnect structure formed within the wafer and the carrier wafer. The carrier wafer includes a material selected from the group consisting of glass, silicon, silicon carbide, and ceramic. The interconnect structure includes a first metal layer formed in the wafer and in electrical contact with the conductive layer, and a second metal layer formed in the carrier wafer and in electrical contact with the conductive layer.

In another embodiment, the present invention is a semiconductor device including a wafer for supporting the semiconductor device, a conductive layer formed over a top surface of the wafer, a carrier wafer permanently bonded over the conductive layer, an interconnect structure formed within the wafer and the carrier wafer, and first and second insulation layers deposited over the first and second metal layers respectively. The interconnect structure includes first and second metal layers. The first or second insulation layer has an etched portion that exposes a portion of the first or second metal layer.

In another embodiment, the present invention is a semiconductor device including a wafer for supporting the semiconductor device, a conductive layer formed over a top surface of the wafer, a carrier wafer permanently bonded over the conductive layer, and an interconnect structure formed within the wafer and the carrier wafer. The interconnect structure is in electrical contact with the conductive layer and a portion of the interconnect structure is exposed.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical function. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
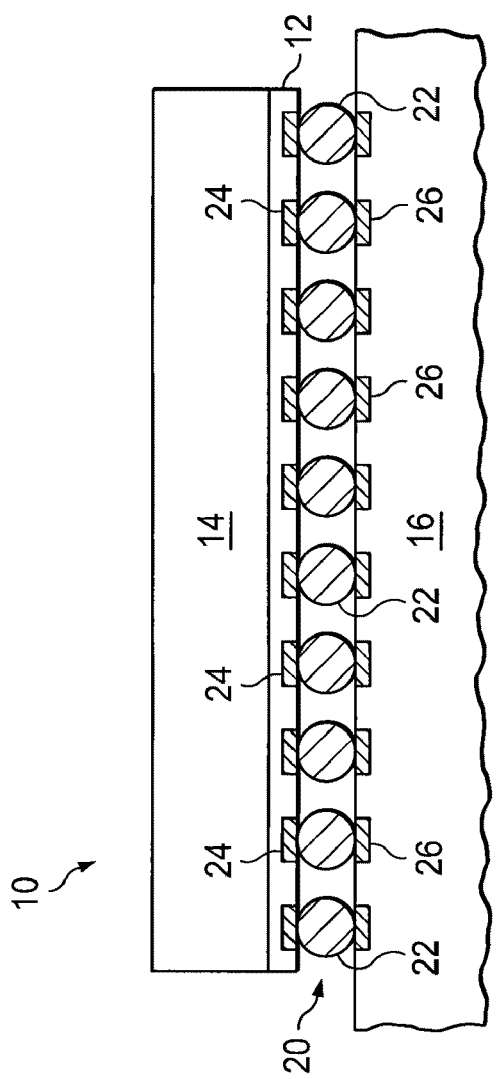
FIG. 1 illustrates a flip chip semiconductor device with solder bumps providing electrical interconnect between an active area of the die and a chip carrier substrate.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 face down toward a chip carrier substrate or printed circuit board (PCB) 16, as shown in FIG. 1. Active area 12 contains active and passive devices, conductive layers, and dielectric layers according to the electrical design of the die. Analog circuits may be created by the combination of one or more passive devices formed within active area 12 and electrically interconnected. For example, an analog circuit may include one or more inductor, capacitor and resistor formed within active area 12. The electrical and mechanical interconnect is achieved through a solder bump structure 20 comprising a large number of individual conductive solder bumps or balls 22. The solder bumps are formed on bump pads or interconnect sites 24, which are disposed on active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation distance, lower capacitance, and achieve overall better circuit performance.

Figure 2A:
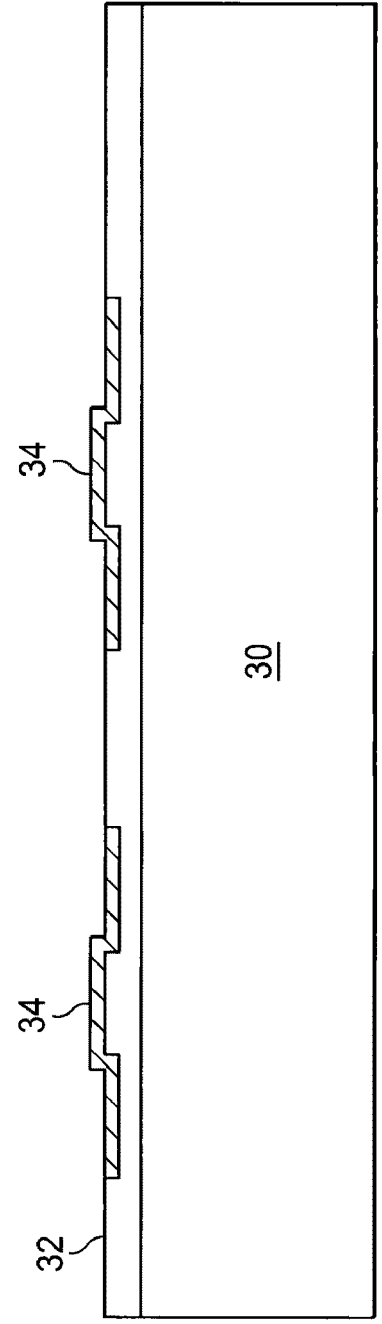
FIGS. 2A-2F illustrate a process of wafer-level integration with a permanent carrier.

FIGS. 2A-2F illustrate a process of 3D wafer-level integration with a permanent carrier. FIG. 2A illustrates a wafer 30 over which insulation layer 32 and thin-film devices or other circuitry are formed. Wafer 30 can be silicon (Si), gallium arsenide (GaAs) or other substrate material. Insulation layer 32 includes one or more layers of a dielectric material such as silicon dioxide ($SiO_2$), silicon oxynitride (SiON), silicon nitride ($Si_3N_4$), tantalum pentoxide ($Ta_2O_5$), and polyimide. Insulation layer 32 is deposited using physical vapor deposition (PVD) or chemical vapor deposition (CVD). Additional devices formed over wafer 30 include active and passive devices such as resistors, capacitors, transistors, and inductors. The devices are made up of patterned conductive, resistive, and dielectric layers and are formed using wafer-level fabrication processes as described above. Additional redistribution layers (RDLs) may be formed over wafer 30 to provide electrical connectivity to external system components. Conductive layer 34 is patterned and deposited over wafer 30. Conductive layer 34 includes aluminum (Al), aluminum alloys, copper (Cu), nickel (Ni), gold (Au), silver (Ag), salicide, polysilicon, or other electrically conductive material suitable for deposition on a substrate. A PVD, CVD, electrolytic plating, or electroless plating process is used to form conductive layer 34.

Figure 2B:
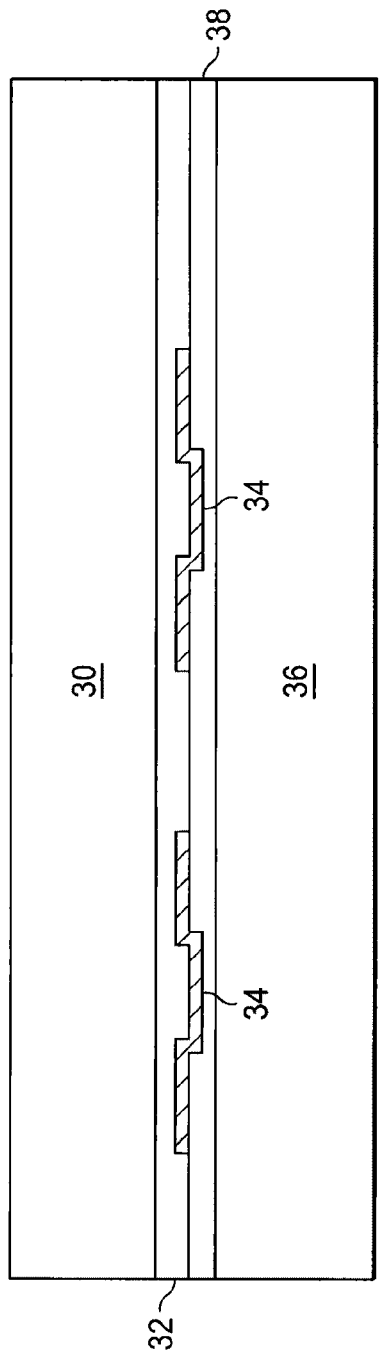

Turning to FIG. 2B, wafer 30 is inverted and mounted to carrier wafer 36 using adhesive layer 38. Carrier wafer 36 includes glass, Si, silicon carbide (SiC), ceramic, or other suitable carrier wafer material. In some cases, carrier wafer 36 includes a high-Q material for the fabrication of integrated passive devices (IPDs) using thin-film technologies, or multi-level routing applications over carrier wafer 36. Adhesive layer 38 includes any suitable adhesive material such as a thermal epoxy.

In an alternative embodiment, however, carrier wafer 36 is bonded to wafer 30 using anodic bonding. In one anodic bonding method, both wafer 30 and carrier wafer 36 are clamped together, placed in a high temperature environment of approximately 400° C., and disposed between two conductive electrodes. A high direct current (DC) potential of over 1 kV is placed across the two electrodes. The high DC potential creates an electric field that penetrates both substrates and renders a surface of carrier wafer 36 highly reactive. The highly reactive surface of carrier wafer 36 forms a strong chemical bond with a surface of wafer 30. If, for example, carrier wafer 36 includes a glass material and wafer 30 includes a Si material, the high potential causes sodium (Na) ions to be displaced from the surface of carrier wafer 36. The depletion of Na ions make the surface of carrier wafer 36 highly reactive with wafer 30 and forms a solid chemical bond between the two substrates. Anodic bonding results in a permanent bond between wafer 30 and carrier wafer 36. The permanent bond allows for additional wafer-level processing over wafer 30 or carrier wafer 36 at relatively high temperatures. In one embodiment, the anodic bond is configured to withstand temperatures of approximately 350° C. to 400° C. during wafer processing.

After wafer 30 is bonded to carrier wafer 36, wafer 30 is thinned to between 40-250 μm. Depending upon the application, however, after thinning, the height of wafer 30 may be less than 40 μm. Wafer 30 is thinned using mechanical backgrinding with an additional wet etching step. Alternatively, plasma etching and/or a chemical-mechanical planarization (CMP) process can be used. In one embodiment, a portion of wafer 30 is initially removed using a back grind process. A second portion of wafer 30 is removed using a wet etch, dry etch, or CMP process.

Figure 2C:
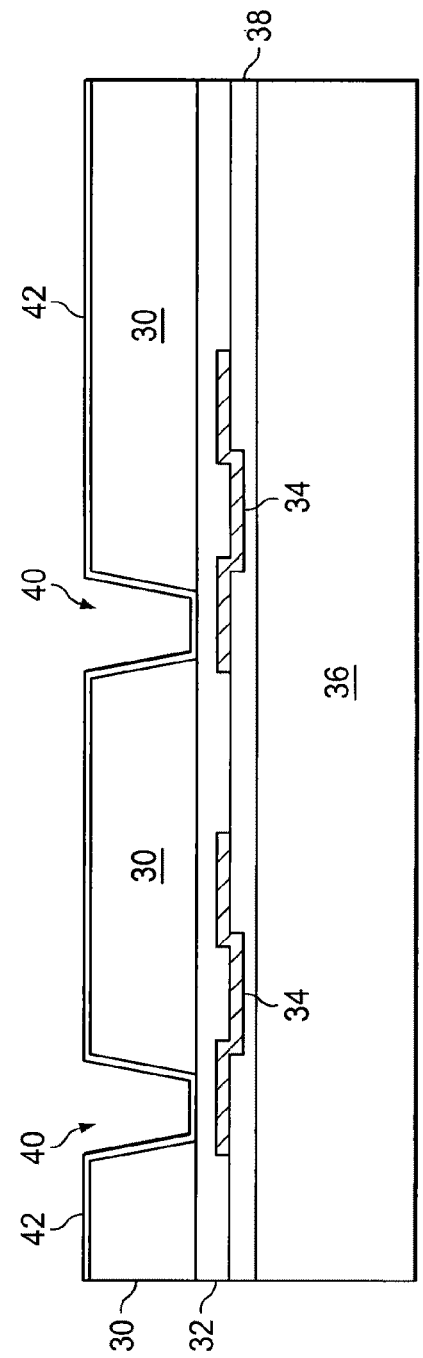

Turning to FIG. 2C, through silicon vias (TSVs) 40 are formed in wafer 30 by etching or laser drilling. TSVs 40 expose a portion of insulation layer 32. Dielectric layer 42 is deposited over TSVs 40. Dielectric layer 42 includes silicon nitride (SiN), tantalum oxide (Ta2O5), hafnium oxide (HfO2), or a dielectric film material.

Figure 2D:
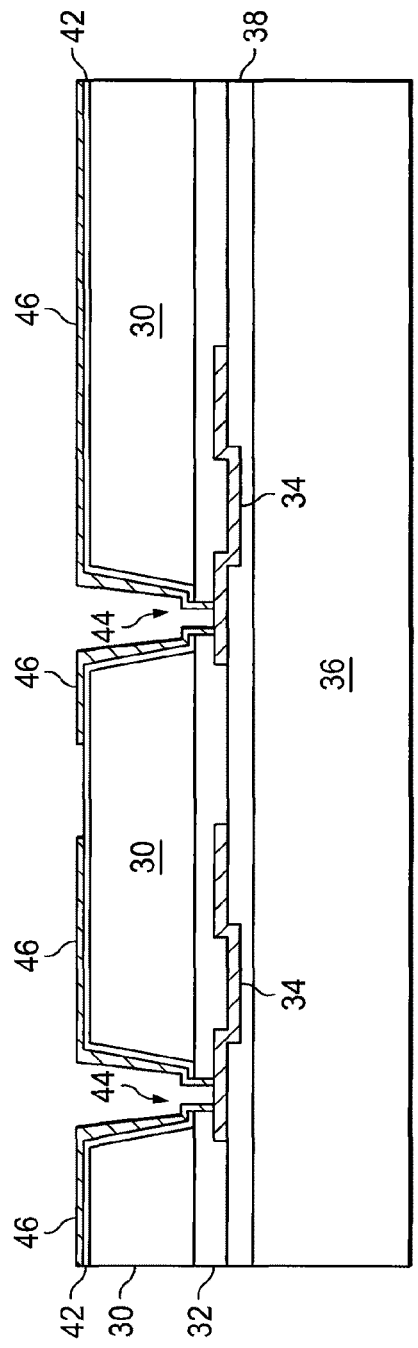

Referring to FIG. 2D, TSVs 40 are further etched to form vias 44. Vias 44 are formed by etching or laser drilling dielectric layer 42 and insulation layer 32 to expose a portion of conductive layer 34. Conductive or metal layer 46 is patterned and deposited over dielectric layer 42 and vias 44 in contact with conductive layer 34. Metal layer 46 includes Al, aluminum alloys, Cu, Ni, Au, Ag, salicide, polysilicon, or other electrically conductive material suitable for deposition on a substrate.

Figure 2E:
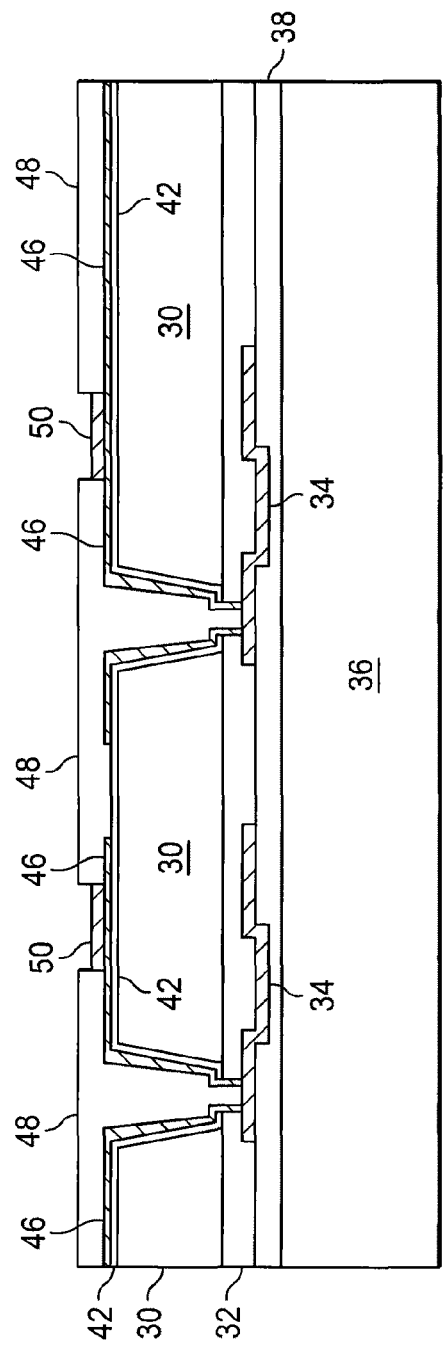

Turning to FIG. 2E, passivation layer 48 is deposited over metal layer 46. Passivation layer 48 is patterned to expose a portion of metal layer 46. Passivation layer 48 includes an insulation material such as polyimide, benzocyclobutene (BCB), polybenzoxazoles (PBO), epoxy based insulating polymer, or other insulating polymer materials. Passivation layer 48 provides physical support and electrical insulation. Under-bump metallization (UBM) 50 is patterned and deposited over passivation layer 48. In an alternative embodiment, UBM 50 is not patterned and is instead deposited directly over the etched portions of passivation layer 48. UBM 50 includes a conductive material and comprises a plurality of contact pads formed in electrical contact with metal layer 46. In one embodiment, UBMs 84 include a wetting layer, barrier layer, and adhesive layer.

Figure 2F:
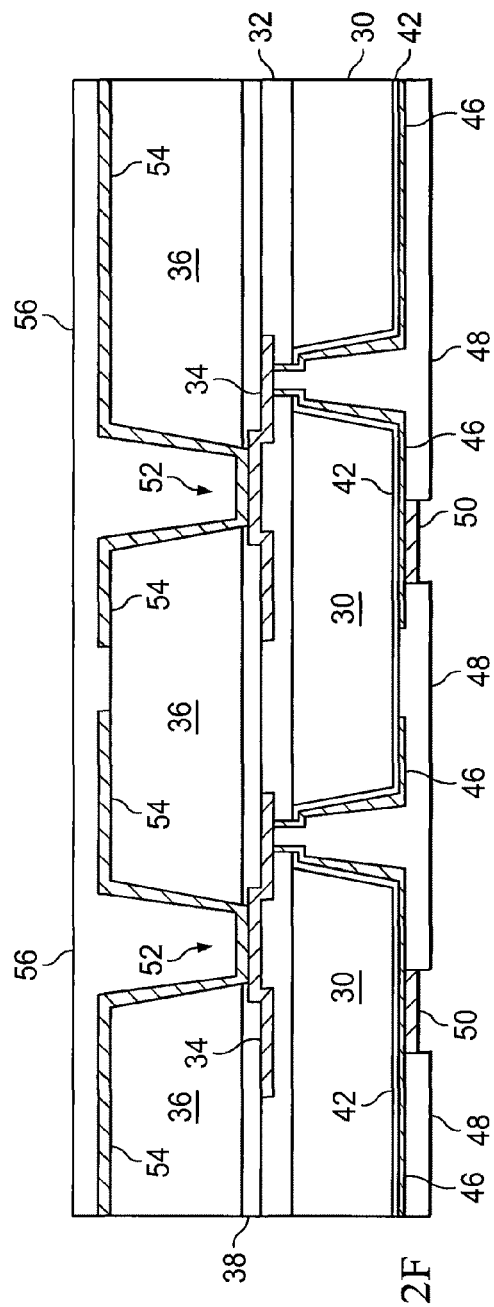

Referring to FIG. 2F, vias 52 are formed in carrier wafer 36 using an etching or laser drilling process. conductive or metal layer 54 is patterned and deposited over vias 52. Passivation layer 56 is deposited over metal layer 54.

Before or after metal layer 54 and passivation layer 56 are deposited over carrier wafer 36, additional processing may be performed over carrier wafer 36. For example, some applications include the formation of IPDs or an IPD network over carrier wafer 36. Similarly, additional re-routing interconnects or RDLs may be formed over carrier wafer 36.

Figure 3:
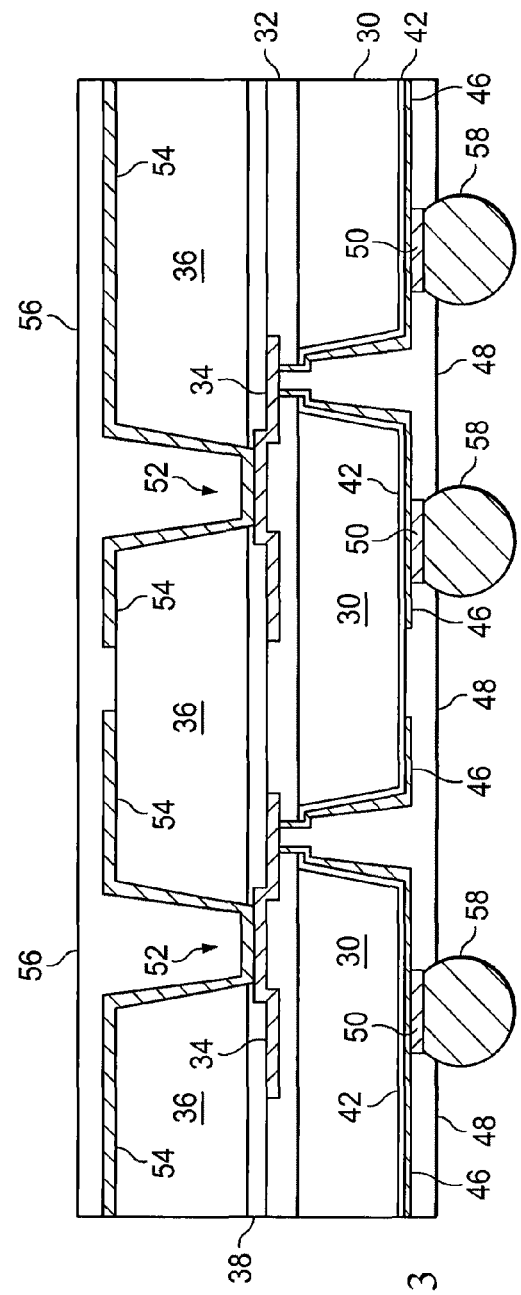
FIG. 3 illustrates a semiconductor device with attached solder bumps.

Turning to FIG. 3, a first packaging option for the device is shown. The device includes wafer 30 having insulation layer 32 and conductive layer 34. Wafer 30 is mounted to carrier wafer 36 using adhesive layer 38. In one embodiment, an anodic bonding process is used to permanently bond wafer 30 and carrier wafer 36. TSVs 40 are formed in wafer 30 and expose a portion of insulation layer 32. Dielectric layer 42 is deposited over TSVs 40. Vias 44 are formed in dielectric layer 42 and insulation layer 32 to expose conductive layer 34. Metal layer 46 is deposited over vias 44 in contact with conductive layer 34. Passivation layer 48 is deposited over metal layer 46. Passivation layer 48 is patterned and UBM 50 is deposited over the openings in passivation layer 48 in contact with metal layer 46. Vias 52 are formed in carrier wafer 36 to expose a portion of conductive layer 34. Metal layer 54, in contact with conductive layer 34, is deposited over vias 52. Passivation layer 56 is deposited over metal layer 54. Bumps 58 are formed and connected to UBM 50 by a reflow process applied to solder material deposited over UBM 50. Bumps 58 include Au, or Cu structures or another conductive material such as tin/lead (Sn/Pb), copper/zinc (CuZn), or copper/silver (CuAg) solder each containing an optional flux material. The solder material is deposited using a ball drop or stencil printing process.

Figure 4:
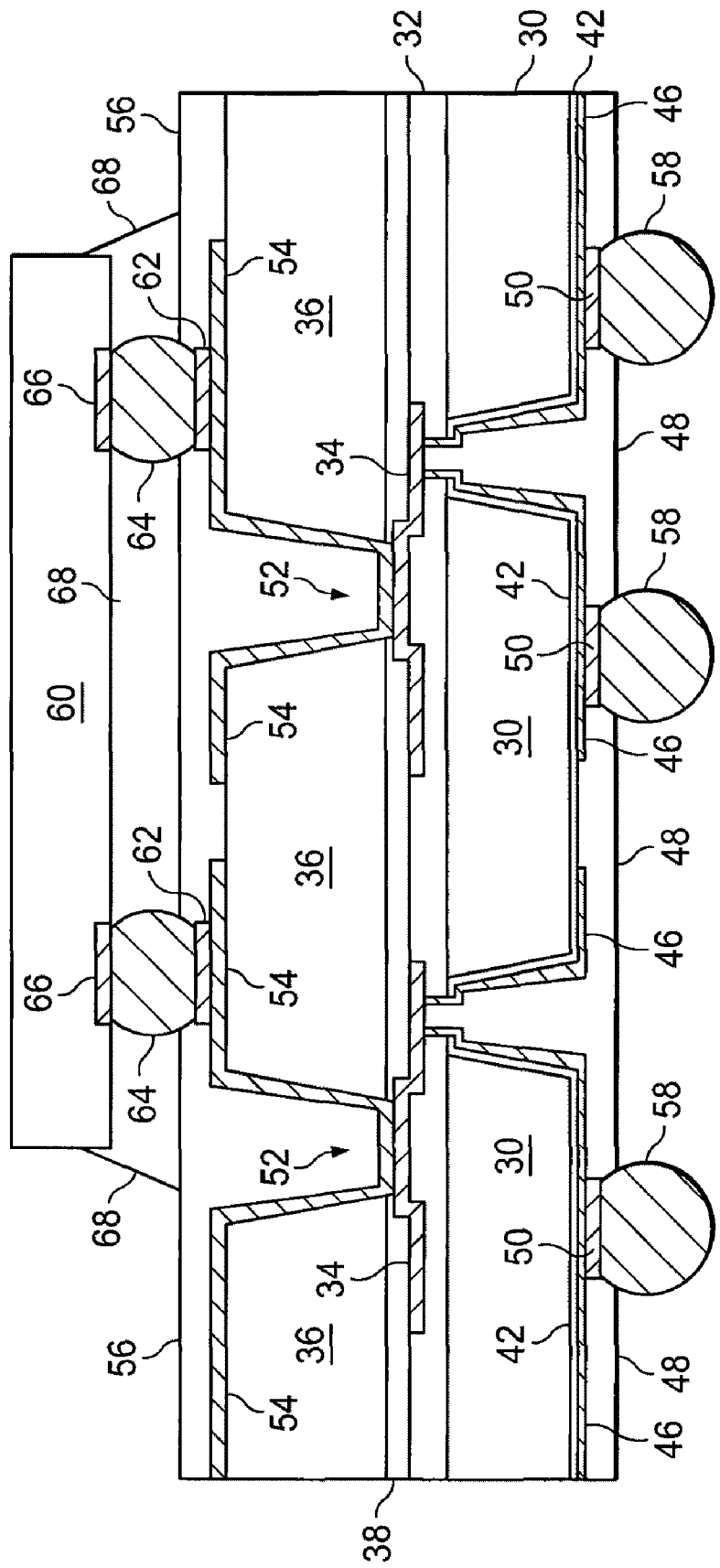
FIG. 4 illustrates a semiconductor device with an attached flip-chip die.

Turning to FIG. 4, package 60 is connected to the device. The device includes wafer 30 having insulation layer 32 and conductive layer 34. Wafer 30 is mounted to carrier wafer 36 using adhesive layer 38. In one embodiment, an anodic bonding process is used to permanently bond wafer 30 and carrier wafer 36. TSVs 40 are formed in wafer 30 and expose a portion of insulation layer 32. Dielectric layer 42 is deposited over TSVs 40. Vias 44 are formed in dielectric layer 42 and insulation layer 32 to expose conductive layer 34. Metal layer 46 is deposited over vias 44 in contact with conductive layer 34. Passivation layer 48 is deposited over metal layer 46. Passivation layer 48 is patterned and UBM 50 is deposited over the openings in passivation layer 48 in contact with metal layer 46. Vias 52 are formed in carrier wafer 36 to expose a portion of conductive layer 34. Metal layer 54, in contact with conductive layer 34, is deposited over vias 52. Passivation layer 56 is deposited over metal layer 54. Package 60 may include radio frequency (RF) or power management devices, memory ICs, filter ICs, microcontrollers, processors, CSPs, WLCSPs or other packaged semiconductor die, electronic component, or combinations thereof. In FIG. 4, package 60 is a flip chip mounted over carrier wafer 36. Passivation layer 56 is patterned to expose a portion of metal layer 54. UBM 62 is deposited over the exposed portions of metal layer 54. Bumps 64 are deposited over UBM 62 and are reflowed to connect UBM 62 and contact pads 66 of package 60. Contact pads 66 are formed on package 60 using an electrolytic plating or electroless plating process and include a conductive material. An optional underfill 68 is deposited between package 60 and passivation layer 56. Underfill 68 provides physical support to package 60. In other embodiments, package 60 is connected to metal layer 54 using an alternative surface mount technology (SMT).

Figure 5:
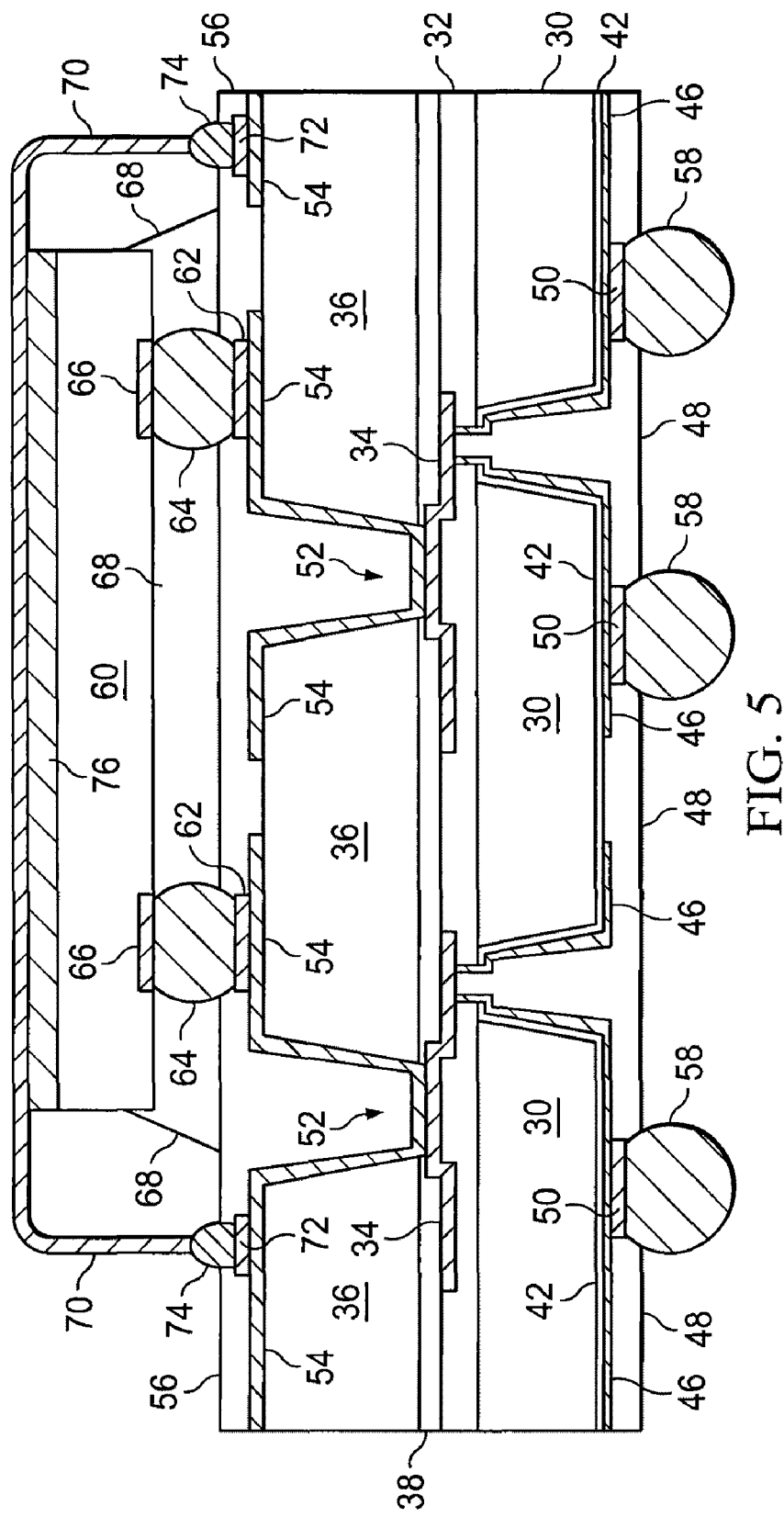
FIG. 5 illustrates a semiconductor device with an attached flip-chip die having electromagnetic interference shielding.

Turning to FIG. 5, electromagnetic (EMI) shield 76 is bonded over the device. The device includes wafer 30 having insulation layer 32 and conductive layer 34. Wafer 30 is mounted to carrier wafer 36 using adhesive layer 38. In one embodiment, an anodic bonding process is used to permanently bond wafer 30 and carrier wafer 36. TSVs 40 are formed in wafer 30 and expose a portion of insulation layer 32. Dielectric layer 42 is deposited over TSVs 40. Vias 44 are formed in dielectric layer 42 and insulation layer 32 to expose conductive layer 34. Metal layer 46 is deposited over vias 44 in contact with conductive layer 34. Passivation layer 48 is deposited over metal layer 46. Passivation layer 48 is patterned and UBM 50 is deposited over the openings in passivation layer 48 in contact with metal layer 46. Vias 52 are formed in carrier wafer 36 to expose a portion of conductive layer 34. Metal layer 54, in contact with conductive layer 34, is deposited over vias 52. Passivation layer 56 is deposited over metal layer 54. Package 60 is a flip chip mounted over carrier wafer 36 using bumps 64. Bumps 64 electrically connect contact pads 66 of package 60 and UBM 62 formed over carrier wafer 36. EMI shield 76 is bonded over package 60 and includes a material such as Cu or nickel silver. EMI shield 76 limits the transmission of electromagnetic radiation into package 60 from an external source, or from within package 60 to other system components. EMI shield 76 is optionally connected to wafer ground using wirebond 70. Passivation layer 56 is patterned to expose a portion of metal layer 54. Over the etched portion of passivation layer 56, UBM 72 is deposited. Bumps 74 are formed at an end of wirebonds 70. Wirebonds 70 are connected between EMI shield 76 and UBM 72. Wirebonds 70 include a conductive material such as Cu, Au, or Ag. In an alternative embodiment, EMI shield 76 is not connected to package 60 and is instead mounted over package 60 with a space between package 60 and EMI shield 76.

Figure 6:
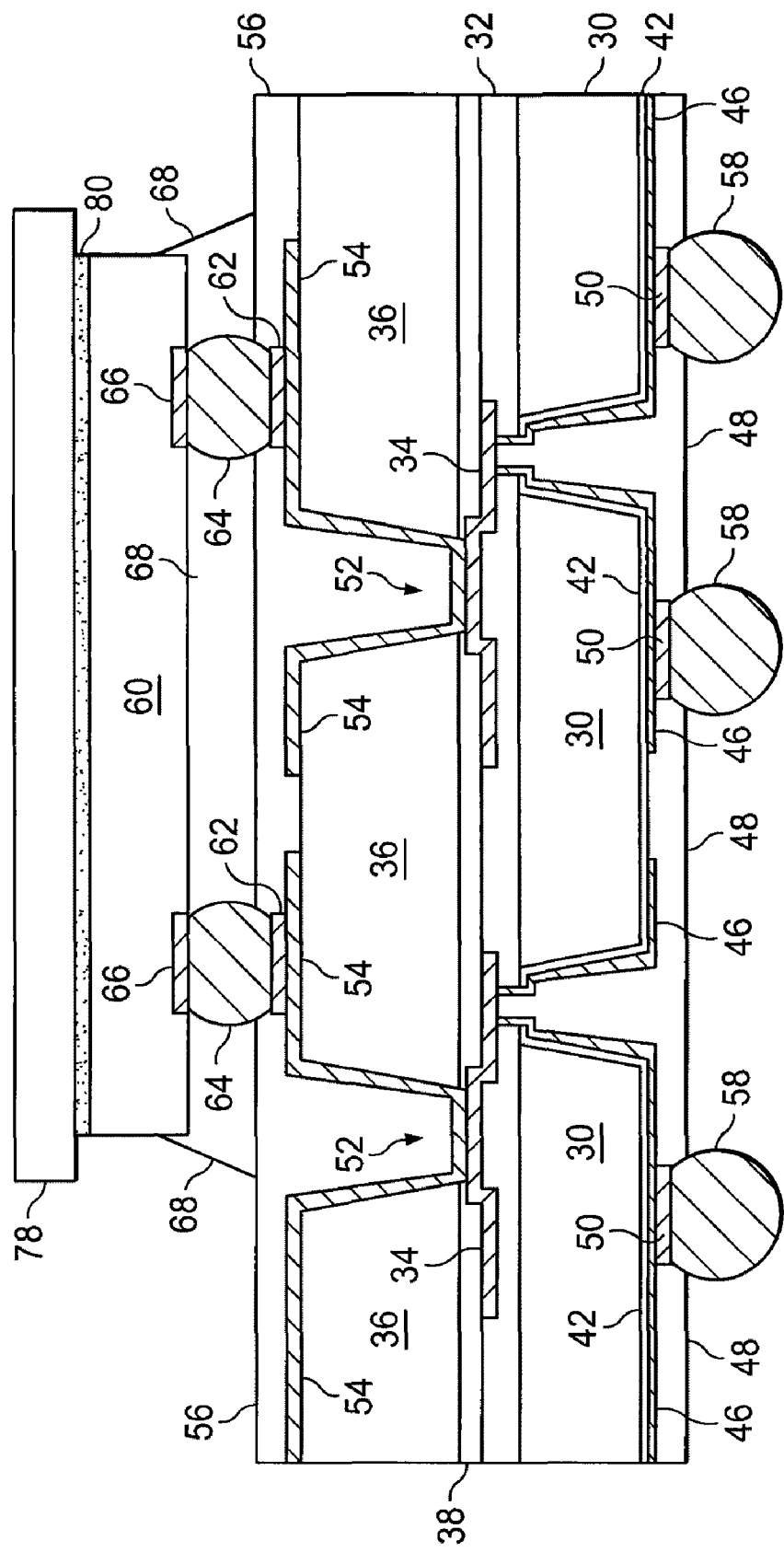
FIG. 6 illustrates a semiconductor device with an attached flip-chip die having a heat sink device.

Turning to FIG. 6, heat sink 78 is connected to the device. The device includes wafer 30 having insulation layer 32 and conductive layer 34. Wafer 30 is mounted to carrier wafer 36 using adhesive layer 38. In one embodiment, an anodic bonding process is used to permanently bond wafer 30 and carrier wafer 36. TSVs 40 are formed in wafer 30 and expose a portion of insulation layer 32. Dielectric layer 42 is deposited over TSVs 40. Vias 44 are formed in dielectric layer 42 and insulation layer 32 to expose conductive layer 34. Metal layer 46 is deposited over vias 44 in contact with conductive layer 34. Passivation layer 48 is deposited over metal layer 46. Passivation layer 48 is patterned and UBM 50 is deposited over the openings in passivation layer 48 in contact with metal layer 46. Vias 52 are formed in carrier wafer 36 to expose a portion of conductive layer 34. Metal layer 54, in contact with conductive layer 34, is deposited over vias 52. Passivation layer 56 is deposited over metal layer 54. Package 60 is a flip chip mounted over carrier wafer 36 using bumps 64. Bumps 64 electrically connect contact pads 66 of package 60 and UBM 62 formed over carrier wafer 36. Heat sink 78 is mounted over package 60 using adhesive layer 80. Heat sink 78 includes a heat spreader and/or heat sink structure to remove heat energy from package 60 and/or to normalize heat distribution over a surface of package 60. Heat sink 78 includes a metal such as Al or Cu or another material with high thermal conductivity.

Figure 7:
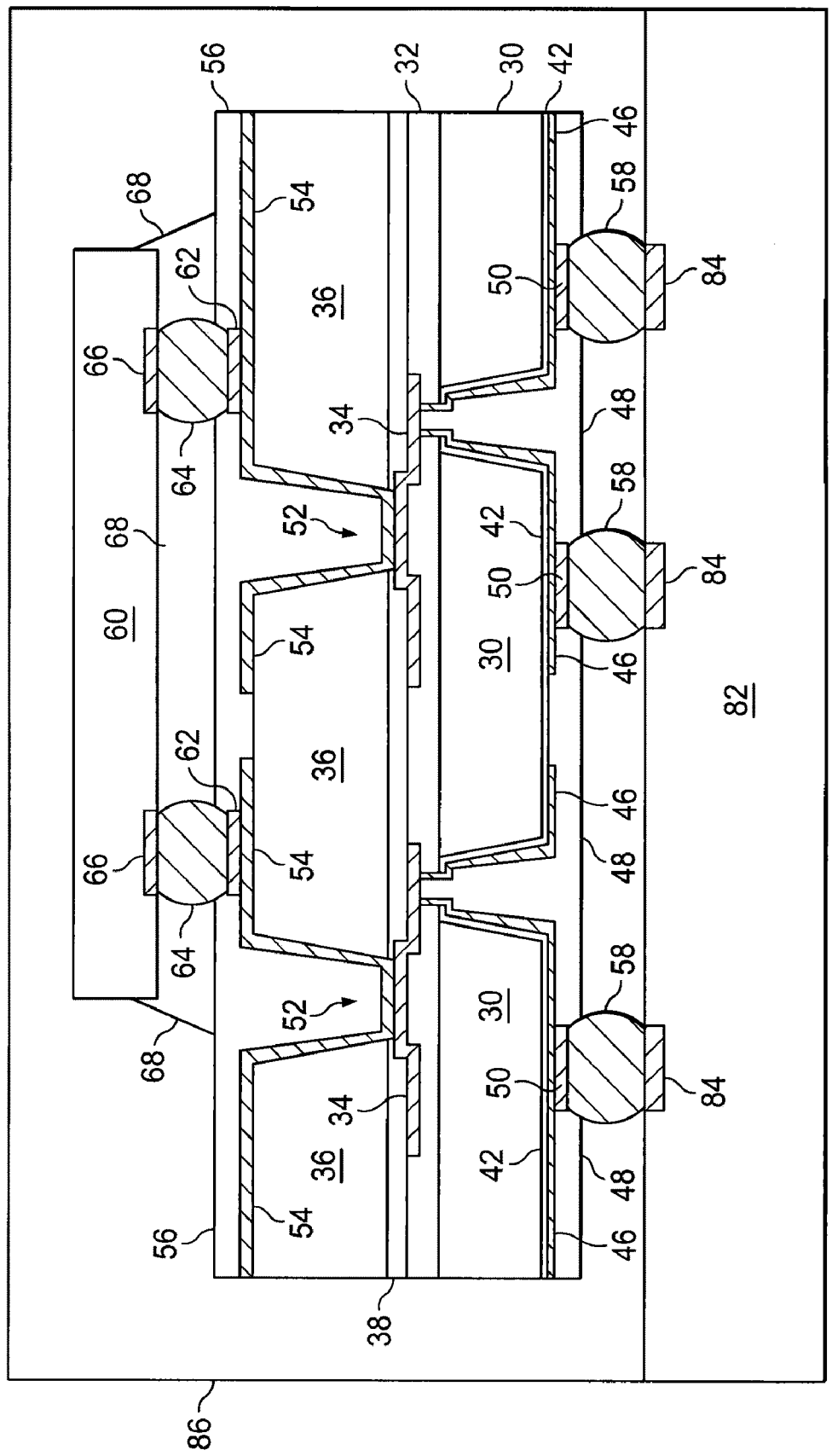
FIG. 7 illustrates an encapsulated semiconductor device.

Referring to FIG. 7, the device is connected to substrate 82. The device includes wafer 30 having insulation layer 32 and conductive layer 34. Wafer 30 is mounted to carrier wafer 36 using adhesive layer 38. In one embodiment, an anodic bonding process is used to permanently bond wafer 30 and carrier wafer 36. TSVs 40 are formed in wafer 30 and expose a portion of insulation layer 32. Dielectric layer 42 is deposited over TSVs 40. Vias 44 are formed in dielectric layer 42 and insulation layer 32 to expose conductive layer 34. Metal layer 46 is deposited over vias 44 in contact with conductive layer 34. Passivation layer 48 is deposited over metal layer 46. Passivation layer 48 is patterned and UBM 50 is deposited over the openings in passivation layer 48 in contact with metal layer 46. Vias 52 are formed in carrier wafer 36 to expose a portion of conductive layer 34. Metal layer 54, in contact with conductive layer 34, is deposited over vias 52. Passivation layer 56 is deposited over metal layer 54. Package 60 is a flip chip mounted over carrier wafer 36 using bumps 64. Bumps 64 electrically connect contact pads 66 of package 60 and UBM 62 formed over carrier wafer 36. UBM 50 of the device is electrically connected to contact pads 84 of substrate 82 by bumps 58. Substrate 82 includes a PCB or other substrate for supporting and mounting electronic components. Contact pads 84 include a conductive material and are formed over substrate 82 using an electrolytic plating or electroless plating process. Bumps 58 are deposited and reflowed to connect contact pads 84 to UBM 50. Encapsulant 86 is deposited over carrier wafer 36, package 60 and substrate 82. Encapsulant 86 includes a mold compound or other insulative material and provides physical support and electrical insulation to the various components of the device. Encapsulant 86 may further include a filler material to assist in matching the coefficient of thermal expansion (CTE) of package 60 to encapsulant 86. With encapsulant 86, the deposition of underfill 68 is optional as shown in FIG. 8.

Figure 8:
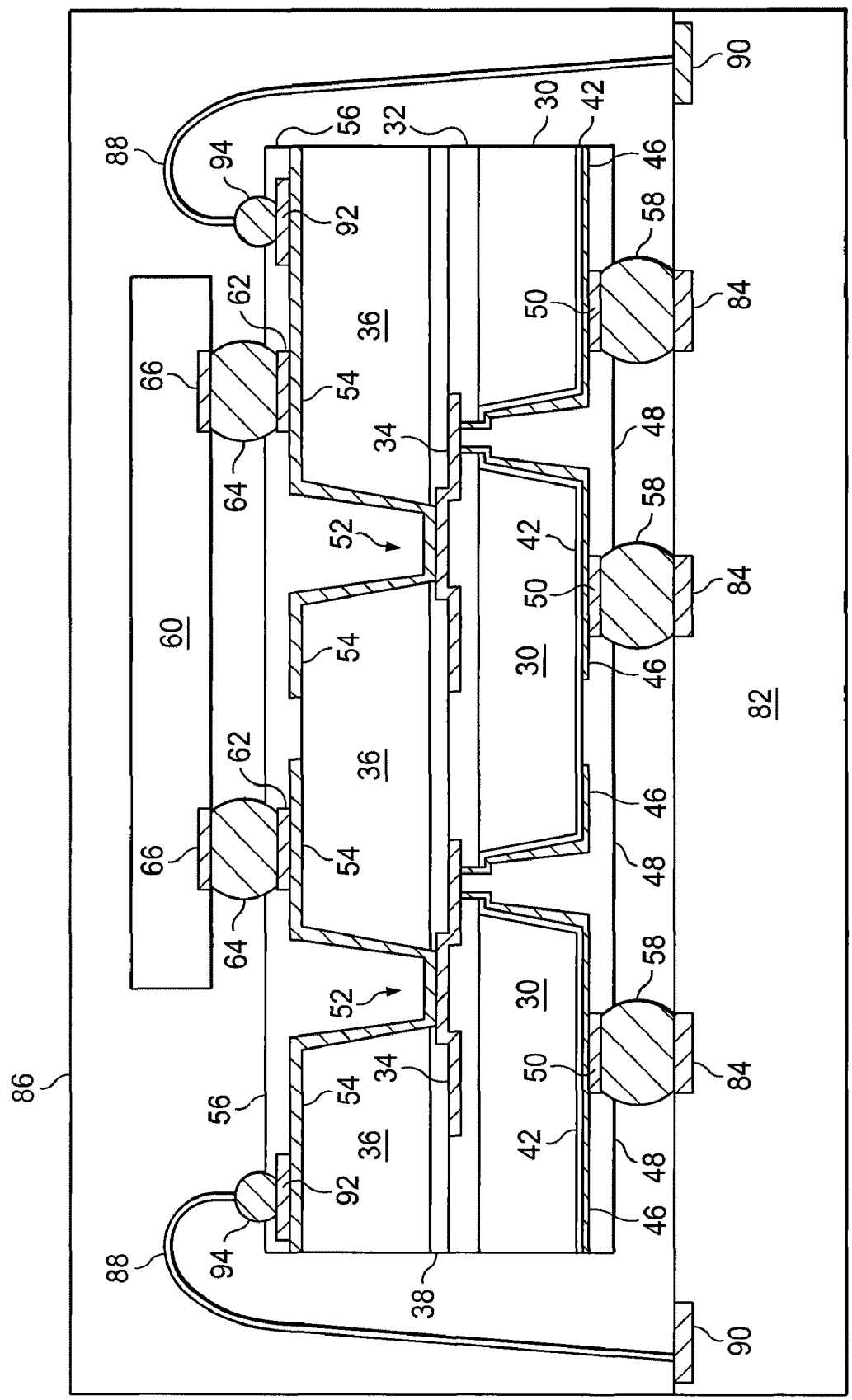
FIG. 8 illustrates an encapsulated and wire-bonded semiconductor device.

Turning to FIG. 8, the device is wire bonded to substrate 82. The device includes wafer 30 having insulation layer 32 and conductive layer 34. Wafer 30 is mounted to carrier wafer 36 using adhesive layer 38. In one embodiment, an anodic bonding process is used to permanently bond wafer 30 and carrier wafer 36. TSVs 40 are formed in wafer 30 and expose a portion of insulation layer 32. Dielectric layer 42 is deposited over TSVs 40. Vias 44 are formed in dielectric layer 42 and insulation layer 32 to expose conductive layer 34. Metal layer 46 is deposited over vias 44 in contact with conductive layer 34. Passivation layer 48 is deposited over metal layer 46. Passivation layer 48 is patterned and UBM 50 is deposited over the openings in passivation layer 48 in contact with metal layer 46. Vias 52 are formed in carrier wafer 36 to expose a portion of conductive layer 34. Metal layer 54, in contact with conductive layer 34, is deposited over vias 52. Passivation layer 56 is deposited over metal layer 54. Package 60 is a flip chip mounted over carrier wafer 36 using bumps 64. Bumps 64 electrically connect contact pads 66 of package 60 and UBM 62 formed over carrier wafer 36. Wirebonds 88 connect metal layer 54 of the device to substrate 82. Wirebonds 88 include a conductive material and connect to contact pads 90 formed over substrate 82. Passivation layer 56 is etched to expose a portion of metal layer 54. UBM 92 is deposited in electrical contact with metal layer 54 over the openings. Bumps 94 are formed at the end of wirebonds 88. Wirebonds 88 connect to UBM 92 and contact pads 90. Wirebonds 88 connect passive networks and other input/output systems within package 60 to substrate 82 and the circuitry and devices therein. Encapsulant 86 is deposited over carrier wafer 36, package 60 and substrate 82.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a wafer for supporting the semiconductor device;
   a conductive layer formed over a top surface of the wafer;
   a carrier wafer permanently bonded over the conductive layer; and
   an interconnect structure formed within the wafer and the carrier wafer, wherein the interconnect structure includes,
   a first via formed in the wafer that exposes the conductive layer,
   a second via formed in the carrier wafer that exposes the conductive layer,
   a first metal layer deposited over the first via, the first metal layer in electrical contact with the conductive layer, and
   a second metal layer deposited over the second via, the second metal layer in electrical contact with the conductive layer.

2. The semiconductor device of claim 1, further including first and second insulation layers deposited over the first and second metal layers respectively, the first or second insulation layer has an etched portion that exposes a portion of the first or second metal layer.

3. The semiconductor device of claim 2, further including:
   a semiconductor package connected over the etched portion of the first or second insulation layer; and
   underfill material deposited between the semiconductor package and the etched portion of the first or second insulation layer.

4. The semiconductor device of claim 1, wherein the carrier wafer further includes a material selected from the group consisting of glass, silicon, silicon carbide, and ceramic.

5. The semiconductor device of claim 1, wherein the carrier wafer is permanently bonded over an active surface of the wafer with an anodic bonding process.

6. The semiconductor device of claim 1, wherein the interconnect structure within the wafer and the carrier wafer is formed with a fabrication process that exceeds approximately 350° C.

7. A semiconductor device, comprising:
a wafer for supporting the semiconductor device;
a conductive layer formed over a top surface of the wafer;
a carrier wafer permanently bonded over the conductive layer, the carrier wafer includes a material selected from the group consisting of glass, silicon, silicon carbide, and ceramic; and
an interconnect structure formed within the wafer and the carrier wafer, the interconnect structure includes:
a first metal layer formed in the wafer and in electrical contact with the conductive layer, and
a second metal layer formed in the carrier wafer and in electrical contact with the conductive layer.

8. The semiconductor device of claim 7, further including:
a first via formed in the wafer, the first metal layer formed in the first via and in electrical contact with the conductive layer; and
a second via formed in the carrier wafer, the second metal layer formed in the second via and in electrical contact with the conductive layer.

9. The semiconductor device of claim 7, further including first and second insulation layers deposited over the first and second metal layers respectively, the first or second insulation layer has an etched portion that exposes a portion of the first or second metal layer.

10. The semiconductor device of claim 9, further including:
an under bump metallization layer formed over the etched portion of the first or second insulation layer; and
solder bumps formed over the under bump metallization layer.

11. The semiconductor device of claim 8, further including a semiconductor package connected to the first or second metal layer.

12. The semiconductor device of claim 8, wherein the interconnect structure is formed within the wafer at temperatures that exceed approximately 350° C.

13. A semiconductor device, comprising:
a first substrate
a conductive layer formed over a surface of the first substrate;
a second substrate permanently bonded to the conductive layer and first substrate;
a first interconnect structure formed over and through the first substrate and electrically connected to the conductive layer;
a second interconnect structure formed over and through the second substrate and electrically connected to the conductive layer; and
a first insulation layer deposited over and into the first interconnect structure; and
a second insulation layer deposited over and into the second interconnect structure.

14. The semiconductor device of claim 13, wherein the first interconnect structure includes:
a first via formed through the first substrate to expose the conductive layer; and
a first metal layer formed over a surface of the first substrate and into the first via and electrically connected to the conductive layer.

15. The semiconductor device of claim 13, further including a semiconductor package mounted to the second interconnect structure.

16. The semiconductor device of claim 13, wherein the second substrate includes a material selected from the group consisting of glass, silicon, silicon carbide, and ceramic.

17. The semiconductor device of claim 13, wherein the second substrate is permanently bonded to the first substrate with an anodic bonding process.

18. The semiconductor device of claim 13, wherein the first interconnect structure is formed over and through the first substrate and the second interconnect structure is formed over and through the second substrate at a temperature in excess of approximately 350° C.

19. The semiconductor device of claim 13, wherein the second interconnect structure includes:
a second via formed through the second substrate to expose the conductive layer; and
a second metal layer formed over a surface of the second substrate and into the second via and electrically connected to the conductive layer.

20. A method of making a semiconductor device, comprising:
providing a first substrate;
forming a first conductive layer over the first substrate;
mounting a second substrate to the first conductive layer and first substrate;
forming a first via through the first substrate to expose the first conductive layer;
conformally applying a first insulating layer over a surface of the first substrate and into the first via;
conformally applying a second conductive layer over the first insulating layer and into the first via and electrically connected to the first conductive layer;
forming a second via through the second substrate to expose the first conductive layer;
conformally applying a third conductive layer over a surface of the second substrate and into the second via and electrically connected to the first conductive layer;
forming a second insulating layer over the second conductive layer and into the first via; and
forming a third insulating layer over the third conductive layer and into the second via.

21. The method of claim 20, including mounting a semiconductor package over the second substrate.

22. The method of claim 21, including depositing an underfill material between the semiconductor package and the second substrate.

23. The method of claim 21, including forming a shield over the semiconductor package.

24. The method of claim 21, including forming a heat sink over the semiconductor package.

25. The method of claim 20, including forming a plurality of bumps over the first conductive layer.

26. The method of claim 20, including forming a fourth insulating layer between the first substrate and second substrate.

27. A method of making a semiconductor device, comprising:
providing a first substrate;
forming a first conductive layer over the first substrate;
mounting a second substrate to the first conductive layer and first substrate;
forming a first via through the first substrate to expose the first conductive layer;

forming a second conductive layer over a surface of the first substrate and into the first via and electrically connected to the first conductive layer;

forming a second via through the second substrate to expose the first conductive layer;

forming a third conductive layer over a surface of the second substrate and into the second via and electrically connected to the first conductive layer;

forming a first insulating layer over the second conductive layer and into the first via; and forming a second insulating layer over the third conductive layer and into the second via.

28. The method of claim 27, including mounting a semiconductor package over the second substrate.

29. The method of claim 28, including depositing an underfill material between the semiconductor package and the second substrate.

30. The method of claim 28, including forming a shield over the semiconductor package.

31. The method of claim 28, including forming a heat sink over the semiconductor package.

32. The method of claim 27, including forming a plurality of bumps over the first conductive layer.

33. The method of claim 27, including forming a third insulating layer between the first substrate and second substrate.

\* \* \* \* \*